US012705524B2

(12) United States Patent
Boothby

(10) Patent No.: US 12,705,524 B2
(45) Date of Patent: Aug. 11, 2026

(54) SYSTEMS AND DEVICES FOR QUANTUM PROCESSOR TOPOLOGY

(71) Applicant: D-WAVE SYSTEMS INC., Burnaby (CA)

(72) Inventor: Kelly T.R. Boothby, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 375 days.

(21) Appl. No.: 18/293,559

(22) PCT Filed: Jul. 27, 2022

(86) PCT No.: PCT/US2022/038498
§ 371 (c)(1),
(2) Date: Jan. 30, 2024

(87) PCT Pub. No.: WO2023/009609
PCT Pub. Date: Feb. 2, 2023

(65) Prior Publication Data

US 2024/0338584 A1 Oct. 10, 2024

Related U.S. Application Data

(60) Provisional application No. 63/227,395, filed on Jul. 30, 2021.

(51) Int. Cl.
*G06N 10/40* (2022.01)
*H10N 60/12* (2023.01)
*H10N 69/00* (2026.01)

(52) U.S. Cl.
CPC ............ *G06N 10/40* (2022.01); *H10N 60/12* (2023.02); *H10N 69/00* (2023.02)

(58) Field of Classification Search
None
See application file for complete search history.

(56) References Cited

U.S. PATENT DOCUMENTS 6,437,413 B1 8/2002 Yamaguchi et al.
6,627,915 B1 9/2003 Ustinov et al.
(Continued)

FOREIGN PATENT DOCUMENTS

CA 2386426 A1 5/2001
WO 0227653 A2 4/2002
(Continued)

OTHER PUBLICATIONS

Amin et al., "Decoherence in adiabatic quantum computation", arXiv:0708.0384v1, Aug. 2, 2007. https://arxiv.org/abs/0708.0384.
(Continued)

*Primary Examiner* — Alexander G Ghyka
(74) *Attorney, Agent, or Firm* — Cozen O'Connor

(57) ABSTRACT

Topologies for analog processors may include cells comprising at least portions of qubits and couplers. Qubits and couplers may be shared among or extend across multiple cells. A cell may include four sets of partial qubits, and partial qubits may form whole qubits with partial qubits in adjacent cells. First and second sets of partial qubits may include partial qubits that extend substantially parallel to one another and along a first direction. Third and fourth sets may include partial qubits that extend substantially parallel to one another and along a second direction. Each partial qubit in the first and second sets may cross, and be substantially orthogonal to, at least one partial qubit from each of the third and fourth sets. A cell may include first and second sets of intra-cell couplers, and partial couplers that form inter-cell couplers with partial couplers in adjacent cells.

16 Claims, 5 Drawing Sheets

(56) References Cited

U.S. PATENT DOCUMENTS 6,627,916 B2 9/2003 Amin et al.
6,670,630 B2 12/2003 Blais et al.
6,784,451 B2 8/2004 Amin et al.
6,822,255 B2 11/2004 Tzalenchuk et al.
6,838,694 B2 1/2005 Esteve et al.
6,885,325 B2 4/2005 Omelyanchouk et al.
6,900,454 B2 5/2005 Blais et al.
6,979,836 B2 12/2005 Zagoskin et al.
6,984,846 B2 1/2006 Newns et al.
7,005,941 B2 2/2006 Bremond et al.
7,018,852 B2 3/2006 Wu et al.
7,133,888 B2 11/2006 Kohn et al.
7,268,576 B2 9/2007 Amin
7,335,909 B2 2/2008 Amin et al.
7,453,162 B2 11/2008 Freedman et al.
7,533,068 B2 5/2009 Maassen et al.
7,566,896 B2 7/2009 Freedman et al.
7,605,600 B2 10/2009 Harris
7,619,437 B2 11/2009 Thom et al.
7,624,088 B2 11/2009 Johnson et al.
7,639,035 B2 12/2009 Berkley
7,687,938 B2 3/2010 Bunyk et al.
7,756,485 B2 7/2010 Paas et al.
7,778,951 B2 8/2010 Gilbert et al.
7,800,395 B2 9/2010 Johnson et al.
7,843,209 B2 11/2010 Berkley
7,876,248 B2 1/2011 Berkley et al.
7,880,529 B2 2/2011 Amin
7,898,282 B2 3/2011 Harris et al.
7,930,152 B2 4/2011 Coffey et al.
7,932,515 B2 4/2011 Bunyk
7,984,012 B2 7/2011 Coury et al.
8,063,657 B2 11/2011 Rose
8,098,179 B2 1/2012 Bunyk et al.
8,102,185 B2 1/2012 Johansson et al.
8,111,083 B1 2/2012 Pesetski et al.
8,159,313 B2 4/2012 Uchaykin
8,169,231 B2 5/2012 Berkley
8,174,305 B2 5/2012 Harris
8,190,548 B2 5/2012 Choi
8,195,596 B2 6/2012 Rose et al.
8,421,053 B2 4/2013 Bunyk et al.
8,441,329 B2 5/2013 Thom et al.
8,536,566 B2 9/2013 Johansson et al.
8,738,105 B2 5/2014 Berkley et al.
8,854,074 B2 10/2014 Berkley
8,951,808 B2 2/2015 Ladizinsky et al.
9,015,215 B2 4/2015 Berkley et al.
9,111,230 B2 8/2015 Gambetta et al.
9,129,224 B2 9/2015 Lanting et al.
9,178,154 B2 11/2015 Bunyk
9,183,508 B2 11/2015 King
9,361,169 B2 6/2016 Berkley
9,524,470 B1 12/2016 Chow et al.
9,633,314 B2 4/2017 Kwon
9,710,758 B2 7/2017 Bunyk et al.
9,727,823 B2 8/2017 Amin et al.
10,013,657 B2 7/2018 Bourassa et al.
10,262,276 B2 4/2019 Puri et al.
10,268,622 B2 4/2019 Hilton et al.
10,572,814 B2 2/2020 Friesen et al.
10,832,155 B2 11/2020 Lechner et al.
11,494,681 B1* 11/2022 Peterson ................. G06F 15/16
11,507,871 B2 11/2022 Boothby et al.
11,615,336 B2 3/2023 Oliver et al.
2005/0250621 A1 11/2005 Corbalis et al.
2012/0319684 A1 12/2012 Gambetta et al.
2014/0229722 A1 8/2014 Harris
2015/0076681 A1 3/2015 Satomi
2018/0032893 A1* 2/2018 Epstein ................... G06F 15/82
2018/0309452 A1* 10/2018 Kerman ................. G06N 10/20
2019/0019099 A1* 1/2019 Hoskinson ............. G06N 10/70
2019/0266508 A1* 8/2019 Bunyk ................ G06F 11/0736
2021/0384404 A1* 12/2021 Finck ................... H10N 60/805
2023/0027682 A1 1/2023 Molavi et al.

FOREIGN PATENT DOCUMENTS

WO 2005093649 A1 10/2005
WO 2007085074 A1 8/2007
WO 2015178990 A2 11/2015
WO 2023009609 A1 2/2023
WO 2023219656 A2 11/2023

OTHER PUBLICATIONS

Amin et al., "Role of Single Qubit Decoherence Time in Adiabatic Quantum Computation", arXiv:0803.1196 [cond-mat.mes-hall], Sep. 17, 2009.

Amin et al., "Thermally assisted adiabatic quantum computation," arXiv:cond-mat/0609332v2, pp. 1-5, (Mar. 2, 2007) Feb. 1, 2006.

Ardavan et al., "Nanoscale solid-state quantum computing", Philosophical Transactions of the Royal Society of London, Jun. 11, 2003.

Averin et al., "Variable Electrostatic Transformer: Controllable Coupling of Two Charge Qubits," Physical Review Letters 91(5): 057003-1-057003-4, Aug. 1, 2003. arXiv:cond-mat/0304166v1, Apr. 7, 2003.

Barends R. et al., "Coherent Josephson qubit suitable for scalable quantum integrated circuits," arXiv:1304.2322v1 [quant-ph], Apr. 8, 2013, 10 pages.

Bell, et al, "Quantum Superinductor With Tunable Non-Linearity", arxiV:1206.0307v2, 2012.

Berggren, "Quantum Computing With Superconductors", Proceedings of the IEEE, vol. 92(10), Oct. 1, 2004. https://www.researchgate.net/publication/2986358_Quantum_Computing_with_Superconductors.

Blatter et al., "Design aspects of superconducting-phase quantum bits," Physical Review B 63: 174511-1-174511-9, 2001.

Boothy et al, "Fast Clique Minor Generation in Chimera Qubit Connectivity Graphs", arXiv:1507.04774v2, 2020.

Boyer et al., "On the Cutting Edge: Simplified O(n) Planarity by Edge Addition", Journal of Graph Algorithms and Applications, Jan. 2004.

Brennen et al., "Why should anyone care about computing with anyons?," arXiv:0704.2241v1 [quant-ph], pp. 1-12, Apr. 18, 2007.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

Butcher, J.R., "Advances in Persistent-Current Qubit Research: Inductively Coupled Qubits and Novel Biasing Methods," Final Report, Delft University of Technology, Jan. 10, 2002, 52 pages.

Carelli et al., "SQUID Systems for Macroscopic Quantum Coherence and Quantum Computing", IEEE trans. Apple. Supercond., Mar. 1, 2001. https://ieeexplore.ieee.org/document/919321.

Chancellor et al., "Circuit design for multi-body interactions in superconducting quantum annealing systems with applications to a scalable architecture", Nature Magazine, Aug. 1, 2017, 2016. https://www.nature.com/articles/s41534-017-0022-6.

Chen et al., "Qubit architecture with high coherences and fast tunable coupling", Physical Review Letters, Feb. 28, 2014. https://arxiv.org/abs/1402.7367.

Childs et al., "Robustness of adiabatic quantum computation", Physical Review A, vol. 65, Oct. 14, 2001.

Clarke et al., "Quiet Readout of Superconducting Flux States," Physica Scripta. T102: 173-177, 2002.

Clarke et al., "Superconducting quantum bits," Nature 453:1031-1042, Jun. 19, 2008.

Cosmelli, C., "Controllable Flux Coupling for the Integration of Flux Qubits," arXiv:cond-mat/0403690v1 [cond-mat.supr-con]. Mar. 29, 2004, 10 pages.

Coury, "Embedding Graphs into Extended Grid", arXiv:cs/0703001 [cs.DM] Feb. 28, 2007. https://arxiv.org/abs/cs/0703001.

Deng et al, "Solving Graph Problems Using Gaussian Boson Sampling", Physical Review Letters 130, 2023.

Devoret et al., "Superconducting Circuits for Quantum Information: An Outlook," Science 339:1169-1174, Mar. 8, 2013.

(56) References Cited

OTHER PUBLICATIONS

Devoret et al., "Superconducting Qubits: A Short Review," arXiv:cond-mat/0411174v1, Nov. 7, 2004, 41 pages.
DiVincenzo, "The Physical Implementation of Quantum Computation," arXiv:quanti-ph/0002077v3, Apr. 13, 2000.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Filippov et al., "Tunable Transformer for Qubits Based on Flux States," IEEE Transactions on Applied Superconductivity 13(2): Jun. 1-4, 2003.
Friedman et al., "Detection of a Schrodinger's Cat State in an rf-SQUID," arXiv:cond-mat/0004293v2 2:1-7, Apr. 19, 2000.
Friedman et al., "Quantum superposition of distinct macroscopic states," Nature 406:43-46, Jul. 6, 2000.
Ghiu et al., "Asymmetric two-output quantum processor in any dimension," arXiv:quant-ph/0610138v1, pp. 1-8, Oct. 17, 2006.
Grajcar et al., "Four-Qubit Device with Mixed Couplings", Physical Review Letters, Feb. 3, 2006. https://journals.aps.org/prl/abstract/10.1103/PhysRevLett.96.047006.
Gutwenger et al., "Graph Drawing Algorithm Engineering with AGD", Software Visualization, 2001.
Han et al., "Time-Resolved Measurement of Dissipation-Induced Decoherence in a Josephson Junction," Science 293:1457-1459, Aug. 24, 2001.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Harris, Sign and Magnitude Tunable Coupler for Superconducting Flux Qubits, arXiv:cond-mat/0608253v1, Aug. 11, 2006 2006.
Hillery et al., "Approximate programmable quantum processors," arXiv:quant-ph/0510161v1, pp. 1-7, Oct. 20, 2005.
Ilichev, et al., "Continuous Monitoring of Rabi Oscillations in a Josephson Flux Qubit", Physical Review Letters 91(9):097906-1-097906-4, week ending Aug. 19, 2003.
Istrail, "Statistical Mechanics, Three-Dimensionality and NP-completeness—I. Universality of Intractability for the Partition Function of the Ising Model Across Non-Planar Lattices", Brown University. 2000.
Kaminsky et al., "Scalable Architecture for Adiabatic Quantum Computing of NP—Hard Problems", arXiv:quant-ph/0211152, Nov. 23, 2002.
Katzgraber et al., "Glassy Chimeras Could be Blind to Quantum Speedup: Designing Better Benchmarks for Quantum Annealing Machines," Physical Review X(4):021008, 2014. (8 pages).
Knysh et al., "Adiabatic Quantum Computing in systems with constant inter-qubit couplings", arXiv:quant-ph/0511131, Nov. 15, 2005.
Koch et al., "Model for I/f Flux Noise in SQUIDs and Qubits," arXiv:cond-mat/0702025v2, pp. 1-14, May 5, 2007.
Krenner et al., "Recent advances in exciton-based quantum information processing in quantum dot nanostructures", New Journal of Physics, Aug. 26, 2005.
Lang, "Analog was not a Computer Trademark!," Sound & Vibration: Aug. 16-24, 2000.
Lechner et al., "A quantum annealing architecture with all-to-all connectivity from local interactions", Science Advances., vol. 1, No. 19, Oct. 23, 2015.
Levinson, "Principles of Lithography", The International Society for Optical Engineering, Bellingham, WA, 2001. (book details provided).
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Lidar, "On the quantum computational complexity of the Ising spin glass partition function and of knot invariants," New Journal of Physics 6(167): 1-15, 2004.
Madou, Fundamentals of Microfabrication: The Science of Miniaturization, CRC Press, 2002, pp. 1-14.
Makhlin et al., "Quantum-state engineering with Josephson-junction devices", arXIv:cond-mat/0011269v1, Nov. 15, 2000.
Martinis et al., "Rabi Oscillations in a Large Josephson-Junction Qubit," Physical Review Letters 89(11):117901-1-117901-4, Sep. 9, 2002.
Martinis, "Superconducting phase qubits," Quantum Inf Process 8:81-103, 2009.
Mc Hugh et al., "A quantum computer using a trapped-ion spin molecule and microwave radiation," arXiv:quant-ph/0310015v2, pp. 1-9, Apr. 13, 2004.
Mizel et al., "Energy barrier to decoherence", Physical Review A, vol. 63, Mar. 19, 2001.
Mutzel, "Optimization in graph drawing", Technische Universitat Wien, 2002.
Nielsen et al., "7.8 Other implementation schemes," in Quantum Computation and Quantum Information, 1st ed., Cambridge University Press, Cambridge, 2000, pp. 343-345.
Nielsen, "Cluster-State Quantum Computation," arXiv:quant-ph/0504097v2, pp. 1-15, Jul. 1, 2005.
Niskanen et al., "Quantum Coherent Tunable Coupling of Superconducting Qubits," Science 316:723-726, May 4, 2007.
Plourde et al., "Entangling Flux Qubits with a Bipolar Dynamic Inductance," Physical Review B 70, arXiv:quant-ph/0406049v1, Jun. 8, 2004, 4 pages.
Ramos et al., "Design for Effective Thermalization of Junctions for Quantum Coherence," IEEE Transactions on Applied Superconductivity 11(1):998-1001, Mar. 2001.
Rocchetto et al., "Stabilizers as a design tool for new forms of the Lechner-Hauke-Zoller annealer", Science Advances, Oct. 21, 2016.
Ryan et al., "Characterization of complex quantum dynamics with a scalable NMR information processor," arXiv:quant-ph/0506085v1, pp. 1-4, Feb. 13, 2006.
Shields et al., "Area efficient layouts of binary trees in grids", ACM Digital Library, 2001.
Shin et al., "How "Quantum" is the D-Wave Machine?", arXiv:1401.7087v2, May 2, 2014.
Shor, "Introduction to Quantum Algorithms," AT&T Labs—Research, arXiv:quant-ph/0005003 v2, pp. 1-17, Jul. 6, 2001.
Steffen et al., "Quantum computing: An IBM perspective", IBM Journal of Research and Development, vol. 55, No. 5, Sep./Oct. 2011.
T. P. Spiller, I. D'Amico & B. W. Lovett, "Entanglement distribution for a practical quantum-dot-based quantum processor architecture", New Journal of Physics 9(2007) 20, Jan. 29, 2007.
Thaker et al., "Quantum Memory Hierarchies: Efficient Designs to Match Available Parallelism in Quantum Computing," arXiv:quant-ph/0604070v1, 12 pages, Apr. 10, 2006.
Tokuda, "Analog Computation Using Single-Electron Circuits", Analog Integrated Circuits and Signal Processing, Oct. 1, 2000. http://lalsie.ist.hokudai.ac.jp/publication/dlcenter.php?fn=paper/aicsp_2000_tokuda.pdf.
Van Dam, "Quantum Computing: In the 'Death Zone'?," Nature Physics 3:220-221, Apr. 2007.
VanDenBrink Mediated Tunable Coupling of Flux Qubits, New Journal of Physics 7 (2005) 230, Nov. 7, 2005.
Vlasov, "Von Neumann Quantum Processors," arXiv:quant-ph/0311196v1, pp. 1-8, Nov. 27, 2003.
Wendin et al., "Superconducting Quantum Circuits, Qubits and Computing," arXiv:cond-mat/0508729v1 [cond-mat.supr-con], Aug. 30, 2005, 60 pages.
Wilhelm, "A Shift In Spectroscopy", Nature vol. 455/4, Sep. 4, 2008.
Wocjan et al., "Treating the Independent Set Problem by 2D Ising Interactions with Adiabatic Quantum Computing," arXiv:quant-ph/0302027v1, pp. 1-13, Feb. 4, 2003.
You, et al., "Fast Two-Bit Operations in Inductively Coupled Flux Qubits," arXiv:cond-mat/0309491v1, pp. 1-5, Sep. 22, 2003.

(56) References Cited

OTHER PUBLICATIONS

Zagoskin et al., "Superconducting Qubits", arXiv:0805.0164 [cond-mat.supr-con], 2008. [0805.0164] Superconducting qubits (arxiv.org).

* cited by examiner 503
504
505
501
506
500
502

SYSTEMS AND DEVICES FOR QUANTUM PROCESSOR TOPOLOGY

FIELD

This disclosure generally relates to designs, layouts, and topologies for quantum processors comprising qubits.

BACKGROUND

Quantum Computation

Quantum computation and quantum information processing are active areas of research and define classes of vendible products. A quantum computer is a system that makes direct use of at least one quantum-mechanical phenomenon, such as, superposition, tunneling, and entanglement, to perform operations on data. The elements of a quantum computer are not binary digits (bits) but typically are quantum binary digits or qubits.

There are several types of quantum computers. An adiabatic quantum computer is a type of quantum computer that can be used to solve various computational problems including optimization problems, for example. Further details on adiabatic quantum computing systems, methods, and apparatus are described in, for example, U.S. Pat. Nos. 7,135,701 and 7,418,283.

Quantum Devices

Quantum devices are structures in which quantum mechanical effects are observable. Quantum devices include circuits in which current transport is dominated by quantum mechanical effects such as electronic spin and superconductivity. Quantum devices can be used for measurement instruments, in computing machinery, and the like.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing.

A quantum processor may be designed to perform quantum annealing and/or adiabatic quantum computation. An evolution Hamiltonian can be constructed that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and A(t), B(t) are coefficients that can control the rate of evolution, and typically lie in the range [0,1].

In some implementations, a time varying envelope function can be placed on the problem Hamiltonian. A suitable delocalization Hamiltonian is given by:

$$H_D \propto -\frac{1}{2}\sum_{i=1}^{N} \Delta_i \sigma_i^x$$

where N represents the number of qubits, $$\sigma_i^x$$

is the Pauli x-matrix for the $i^{th}$ qubit and $\Delta_i$ is the single qubit tunnel splitting induced in the $i^{th}$ qubit. Here, the $$\sigma_i^x$$

terms are examples of "off-diagonal" terms.

A common problem Hamiltonian includes a first component proportional to diagonal single qubit terms and a second component proportional to diagonal multi-qubit terms, and may be of the following form:

$$H_P \propto -\frac{\varepsilon}{2}\left[\sum_{i=1}^{N} h_i \sigma_i^z + \sum_{j>i}^{N} J_{ij} \sigma_i^z \sigma_j^z\right]$$

where N represents the number of qubits, $$\sigma_i^z$$

is the Pauli z-matrix for the $i^{th}$ qubit, $h_i$ and $J_{ij}$ are dimensionless local fields for the qubits, and couplings between qubits, and ε is some characteristic energy scale for $H_P$.

Here, the $$\sigma_i^z \text{ and } \sigma_i^z \sigma_j^z$$

terms are examples of "diagonal" terms. The former is a single qubit term and the latter a two qubit term.

Throughout this specification, the terms "problem Hamiltonian" and "final Hamiltonian" are used interchangeably unless the context dictates otherwise. Certain states of the quantum processor are, energetically preferred, or simply preferred by the problem Hamiltonian. These include the ground states but may include excited states.

Hamiltonians such as $H_D$ and $H_P$ in the above two equations, respectively, may be physically realized in a variety of different ways. A particular example is realized by an implementation of superconducting qubits.

Superconducting Qubits

Superconducting qubits are solid state qubits based on circuits of superconducting materials. Operation of superconducting qubits is based on the underlying principles of magnetic flux quantization, and Josephson tunneling. Superconducting effects can be present in different configurations, and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi LI_C/\Phi_0$ (where L is the geometric inductance, $I_C$ is the critical current of the Josephson junction, and $\phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of example quantum processors that may be used in conjunction with the present systems and devices are described in, for example, U.S. Pat. Nos. 7,533,068; 8,008,942; 8,195,596; 8,190,548; and 8,421,053.

BRIEF SUMMARY

A quantum processor may be summarized as including a plurality of cells tiled over an area such that each cell is positioned proximately adjacent at least one other cell. Each cell may comprise a plurality of partial qubits, and each partial qubit in the plurality of qubits may comprise at least a portion of a length of a whole qubit. The plurality of partial qubits may comprise: a first set of partial qubits, each partial qubit in the first set of partial qubits extending substantially along a first direction; a second set of partial qubits, each partial qubit in the second set of partial qubits extending substantially along the first direction, and each partial qubit in the second set of partial qubits is substantially parallel with each partial qubit in the first set of partial qubits; a third set of partial qubits, each partial qubit in the third set of partial qubits extending substantially along a second direction, and each partial qubit in the third set of partial qubits crosses at least one partial qubit in the first set of partial qubits and at least one partial qubit in the second set of partial qubits; and a fourth set of partial qubits, each partial qubit in the fourth set of partial qubits extending substantially along the second direction, each partial qubit in the fourth set of partial qubits is substantially parallel with each partial qubit in the third set of partial qubits, and each partial qubit in the fourth set of partial qubits crosses at least one partial qubit in the first set of partial qubits and at least one partial qubit in the second set of partial qubits. Each cell may comprise a first set of couplers, each coupler in the first set of couplers communicatively couples a partial qubit extending substantially along the first direction and a partial qubit extending substantially along the second direction. Each cell may comprise a second set of couplers, and each coupler in the second set of couplers communicatively couples a partial qubit in the first set of partial qubits to a partial qubit in the second set of partial qubits, or a partial qubit in the third set of partial qubits to a partial qubit in the third set of partial qubits. The quantum processor may comprise a set of inter-cell couplers, each inter-cell coupler of the set of inter-cell couplers communicatively couples two partial qubits in adjacent cells, and the two partial qubits belong to a same set of partial qubits, each in different cells.

In some implementations, partial qubits extending substantially along the first direction may be substantially orthogonal to partial qubits extending substantially along the second direction.

In some implementations, each partial qubit in at least one of the first set of partial qubits, the second set of partial qubits, the third set of partial qubits, and the fourth set of partial qubits may comprise half of the length of a whole qubit.

In some implementations, at least one set of partial qubits in each cell may form a set of whole qubits with a set of partial qubits in an adjacent cell.

In some implementations, each whole qubit in a set of whole qubits may span a majority of a length of two cells.

In some implementations, the partial qubits of the first set of partial qubits may extend substantially parallel to a first major axis, the first major axis extending substantially along the first direction. The partial qubits of the second set of partial qubits may extend substantially parallel to a second major axis along, the second major axis extending substantially along the first direction. The partial qubits of the third set of partial qubits may extend substantially parallel to a third major axis, the third major axis extending substantially along the second direction. The partial qubits of the fourth set of partial qubits may extend substantially parallel to a fourth major axis, the fourth major axis extending substantially along the second direction. Both of the first major axis and the second major axis may cross both of the third major axis and the fourth major axis.

In some implementations, pairs of crossing major axes may be substantially orthogonal to one another.

In some implementations, each partial qubit of the first set of partial qubits may extend substantially parallel to a respective first major axis that extends substantially along the first direction, and each respective first major axis may be parallel to all other respective first major axes of other partial qubits in the first set of partial qubits. Each partial qubit of the second set of partial qubits may extend substantially parallel to a respective second major axis that extends substantially along the first direction, and each respective second major axis may be parallel to all other respective second major axes of other partial qubits in the second set of partial qubits and the respective first major axes of the partial qubits in the first set of partial qubits. Each partial qubit of the third set of partial qubits may extend substantially parallel to a respective third major axis that extends substantially along the second direction, and each respective third major axis may be parallel to all other respective third major axes of other partial qubits in the third set of partial qubits. Each partial qubit of the fourth set of partial qubits may extend substantially parallel to a respective fourth major axis that extends substantially along the second direction, and each respective fourth major axis may be substantially parallel to all other respective fourth major axes of other partial qubits in the fourth set of partial qubits and the respective third major axes of the partial qubits in the third set of partial qubits.

In some implementations, each respective first major axis of each partial qubit in the first set of partial qubits may cross: at least one third major axis and at least one fourth major axis; each respective second major axis of each partial qubit in the second set of partial qubits may cross: at least one third major axis and at least one fourth major axis; each respective third major axis of each partial qubit in the third set of partial qubits may cross: at least one first major axis and at least one second major axis; and, each respective fourth major axis of each partial qubit in the fourth set of partial qubits may cross: at least one first major axis and at least one second major axis.

In some implementations, each pair of crossing major axes may be substantially orthogonal to one another.

In some implementations, each coupler in the first set of couplers may be positioned at a region proximate to a location at which the partial qubit extending substantially along the first direction meets the partial qubit extending substantially along the second direction.

In some implementations, each coupler in the second set of couplers may communicatively couple each partial qubit in the first set of partial qubits to a nearest-neighboring partial qubit in the second set of partial qubits and may communicatively couple each partial qubit in the third set of partial qubits to a nearest neighboring partial qubit in the fourth set of partial qubits.

In some implementations, each whole qubit may be a superconducting flux qubit.

In some implementations, each whole qubit may comprise: a Josephson junction; a first qubit loop formed by a first superconducting current path; and a second qubit loop formed by a second superconducting current path. The first qubit loop and the second qubit loop may consist of a material that exhibits superconducting behavior at and below a critical temperature.

In some implementations, the Josephson junction is selected from a group consisting of: a compound Josephson junction and a compound-compound Josephson junction.

In some implementations, the first qubit loop and the second qubit loop may be substantially symmetric about an axis of the Josephson junction, the axis of the Josephson junction intersecting a first connection between the first qubit loop, the second qubit loop, and the Josephson junction, and a second connection between the first qubit loop, the second qubit loop, and the Josephson junction.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been selected for ease of recognition in the drawings.

DETAILED DESCRIPTION

Preamble

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word “comprising” is synonymous with “including,” and is inclusive or open-ended (i.e., does not exclude additional, unrecited elements or method acts).

Reference throughout this specification to “one implementation” or “an implementation” means that a particular feature, structure, or characteristic described in connection with the implementation is included in at least one implementation. Thus, the appearances of the phrases “in one implementation” or “in an implementation” in various places throughout this specification are not necessarily all referring to the same implementation. Furthermore, the particular features, structures, or characteristics may be combined in any suitable manner in one or more implementations.

As used in this specification and the appended claims, the singular forms “a,” “an,” and “the” include plural referents unless the context clearly dictates otherwise. It should also be noted that the term “or” is generally employed in its sense including “and/or” unless the context clearly dictates otherwise. The headings and Abstract of the Disclosure provided herein are for convenience only and do not interpret the scope or meaning of the implementations.

Example Hybrid Computing System

Figure 1:
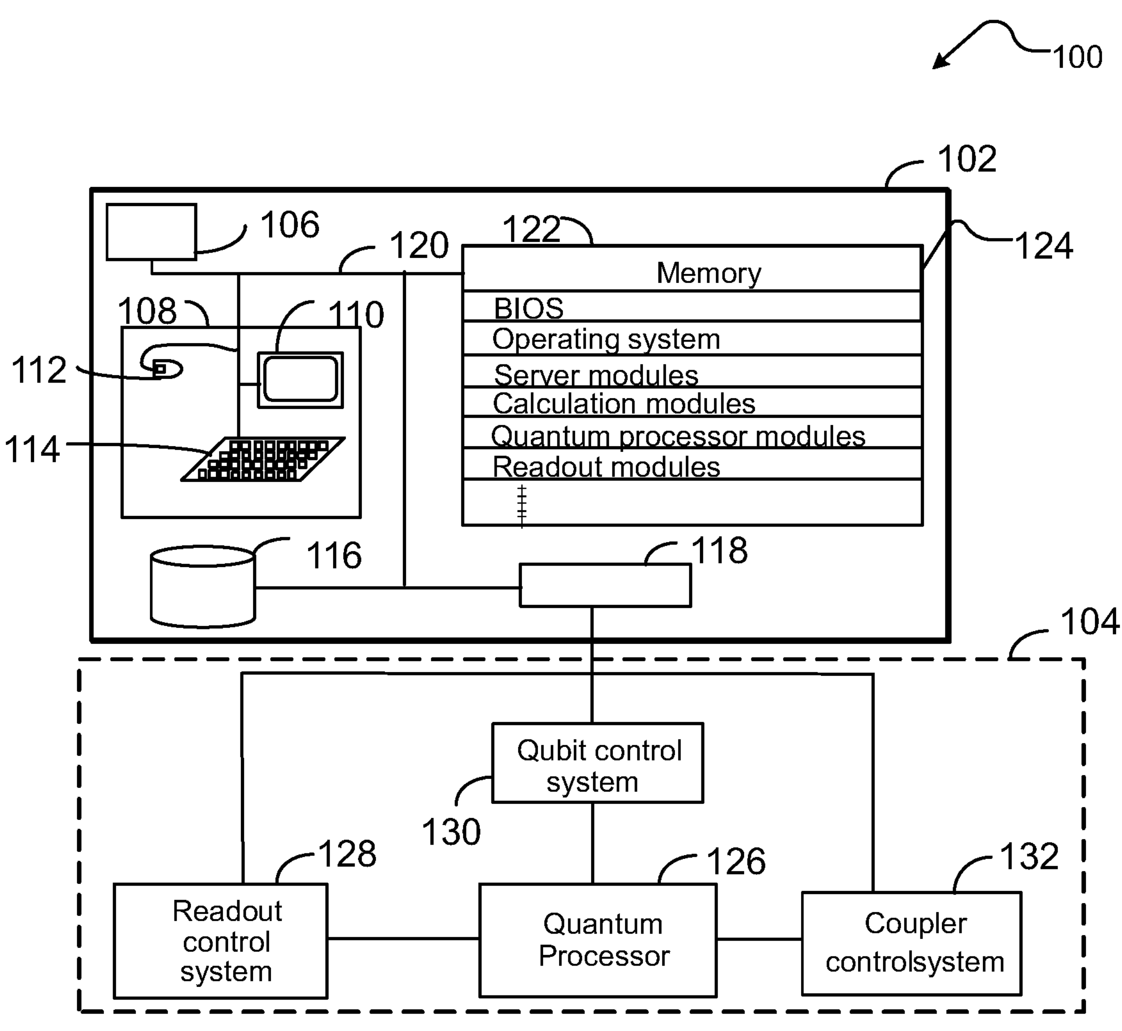
FIG. 1 is a schematic diagram that illustrates an example hybrid computer including a digital processor and an analog processor in accordance with the present systems and devices.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102.

Digital computer 102 may include a user input/output subsystem 108. In some implementations, user input/output subsystem includes one or more user input/output components such as a display 110, a mouse 112, and/or a keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of non-transitory and non-volatile computer-readable media may be employed. Those skilled in the relevant art will appreciate that some computer architectures employ non-transitory volatile memory and non-transitory non-volatile memory. For example, data in volatile memory may be cached to non-volatile memory or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104. For example, the system memory 122 may store processor- or computer-readable instructions, data structures, or other data which, when executed by a processor or computer causes the processor(s) or computer(s) to execute methods, such as methods for performing computations using analog computer 104.

Analog computer 104 may include at least one analog processor such as a quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via a readout control system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines.

In one implementation, quantum processor 126 is a superconducting quantum processor including a number of qubits and associated couplers providing communicative coupling between qubits. The plurality of qubits may be arranged to form an interconnected topology (which, hereinafter may also be referred to as a "topology"). Further details and embodiments of example quantum processors that may be used in conjunction with the present systems and devices are described in, for example, U.S. Pat. Nos. 7,533,068; 8,008,942; 8,195,596; 8,190,548; 8,421,053; and 9,710,758.

Couplers can provide communicative coupling between qubits in a quantum processor. Coupling can be, for example, between adjacent and/or non-adjacent qubits. Unless expressly indicated otherwise, as used herein and in the claims, the terms couple, couples, coupling and variations of such means direct or indirect communicative coupling or communications between two or more components.

In some implementations, qubit control system 130 and coupler control system 132 may be used to implement a quantum annealing schedule as described herein on analog processor 104. In accordance with some implementations of the present disclosure, a quantum processor, such as quantum processor 126, may be designed to perform quantum annealing and/or adiabatic quantum computation.

Alternatively, a quantum processor, such as quantum processor 126, may be a universal quantum computer, and may be designed to perform universal adiabatic quantum computing, or other forms of quantum computation such as gate model-based quantum computation.

Example Topology of a Quantum Processor

The design and selection of an analog processor's topology (also referred to herein as the architecture)—that is, the arrangement defining the interconnection of qubits and couplers and/or other quantum devices—is an important aspect of analog processor design. Particular topologies may be better suited to solving certain classes of problems than others. U.S. Pat. No. 8,772,759 provides various examples of analog processor topologies.

A computational problem to be solved by a hybrid computing system can be mapped to a topological representation that is embedded onto an analog processor, such that a topology of qubits in the analog processor can be used to solve the problem. In an implementation, the topological representation is in a form of at least one of: a planar graph or a non-planar graph. In another implementation, the topological representation is a graph in the form of: a plurality of vertices, and one or more edges. In another implementation, the topological representation is an interconnected graph of the same structure had by the topology of qubits.

In some implementations, a memory associated with a hybrid computing system, such as memory 122 of computing system 100, includes logic to map a computational problem into at least one of a problem of equivalent, greater, or lesser complexity class. In an implementation, the logic to map the computational problem onto an analog processor, such as that provided by analog computer 104 includes instructions for mapping the computational problem onto a topological representation and embedding the topological representation onto the analog processor 150.

Throughout this specification and the appended claims, the "architecture" or "topology" of a quantum processor is defined by the pattern of connectivity between qubits and couplers in the quantum processor. In some implementations, the qubits and couplers in a quantum processor are arranged in an architecture (or topology) such that the architecture comprises a number of sub-topologies, each sub-topology also referred to herein as a cell.

A cell is a repeated sub-topology of a quantum processor topology comprising at least portions of qubits and couplers. A qubit may be included in multiple cells and a coupler may be shared among multiple cells. A plurality of cells tiled over an area produces a certain quantum processor architecture or topology.

As used herein, the term "partial" (e.g., partial qubit, partial coupler) means that one portion of an entire device (e.g., qubit, coupler) resides or is encompassed by the respective cell, while another portion or portions of the entire device reside or is encompassed by another cell or other cells (e.g., a qubit or a coupler extends across two or more cells in a given quantum processor topology comprised of a pattern of cells).

An analog processor or quantum processor, such as quantum processor 126, can employ any of the architectures or topologies described herein.

Figure 2:
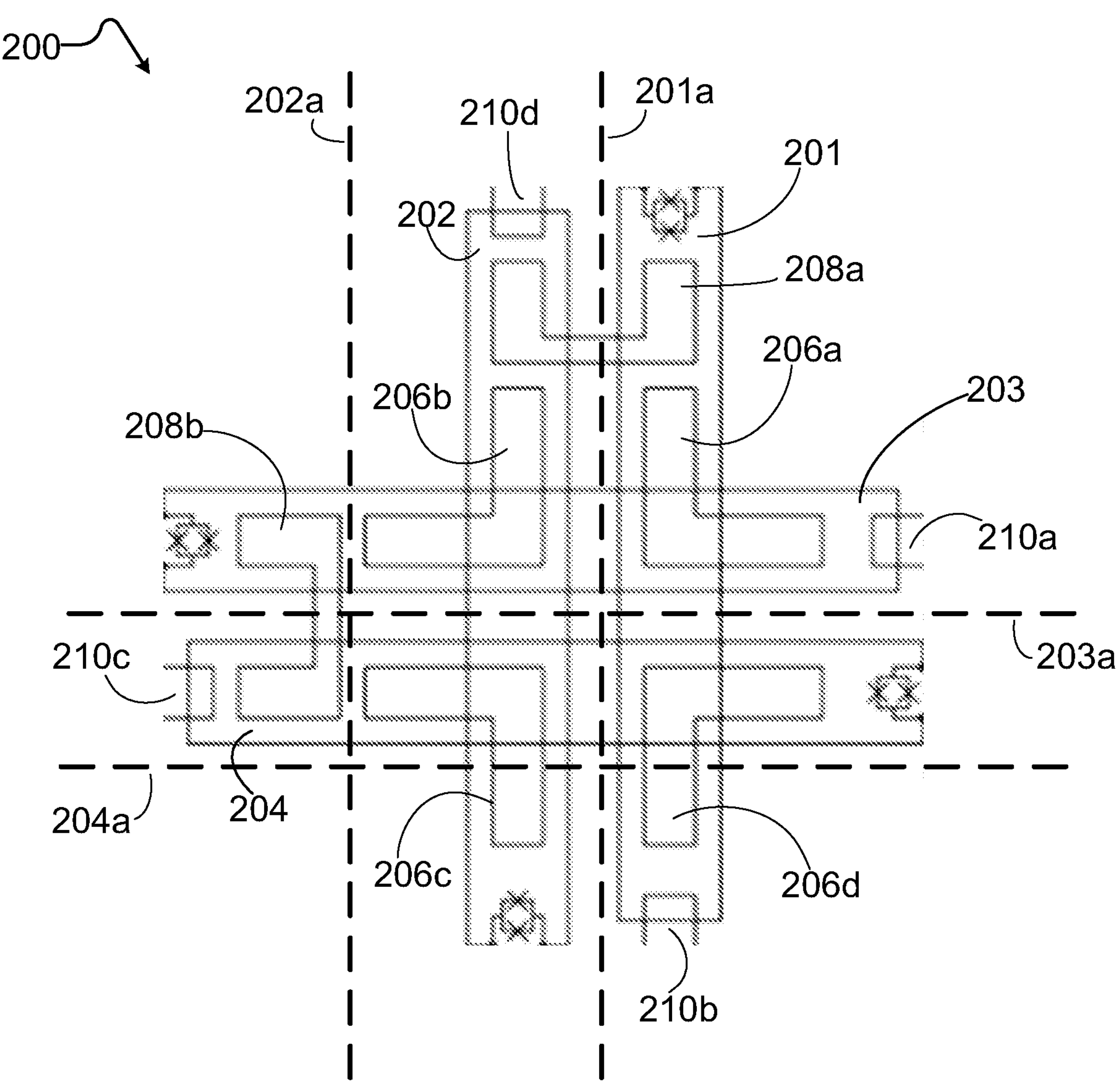
FIG. 2 is a schematic diagram of an example cell in a quantum processor in accordance with the present systems and devices.

FIG. 2 is a schematic diagram of an example of a cell 200 of a quantum processor according to at least one implementation of the present systems and devices.

Cell 200 comprises four sets of partial qubits: a first set of partial qubits 201; a second set of partial qubits 202; a third set of partial qubits 203; and a fourth set of partial qubits 204 (only one partial qubit in each set of partial qubits is shown in FIG. 2). Each partial qubit in first set of partial qubits 201, second set of partial qubits 202, third set of partial qubits 203, and fourth set of partial qubits 204 comprises at least a portion of a respective length of a respective whole qubit. In one implementation, each partial qubit in at least one of the sets of partial qubits 201, 202, 203, 204 comprises half of a length of the respective whole qubit.

Partial qubits of each set of partial qubits 201, 202, 203, 204 can be portions of superconducting flux qubits only a portion of the qubit within a given cell hence denominated as a partial qubit. Each partial qubit may include a respective partial loop of superconducting material where at least a first portion of each loop of superconducting material extends along a respective major or longitudinal axis, only a portion of the loop within a given cell hence denominated as a partial loop superconducting material. In at least one implementation, at least some of the partial qubits are interrupted by at least one respective Josephson junction.

In the implementation illustrated in FIG. 2, first set of partial qubits 201 comprises one partial qubit. The partial qubit of first set of partial qubits 201 is laid out generally vertically in the plane of the page of FIG. 2, and may be referred to herein as having a "first orientation" and/or as extending substantially along a "first direction". The partial qubit of first set of partial qubits 201 has a first longitudinal or first major axis 201*a*, along which a portion of a superconductive loop of the partial qubit extends in a lengthwise direction of the partial qubit (i.e., extends substantially in the first direction). In some implementations, the partial qubit of first set of partial qubits 201 is parallel to first major axis 201*a*.

However, in some implementations, first set of partial qubits 201 may comprise n partial qubits, where n is an integer greater than one. The n partial qubits of first set of partial qubits 201 are parallel with the other n partial qubits. In some implementations, each of the n partial qubits in first set of partial qubits 201 has a respective first major axis along which a portion of a respective superconductive loop of each of the n partial qubits extends in a lengthwise direction of the partial qubit (i.e., extends substantially in the first direction). The respective first major axes of the n partial qubits of first set of partial qubits 201 are parallel with the other first major axes.

In other implementations, all n partial qubits of first set of partial qubits 201 can share a single first major axis 201*a* that is substantially parallel with most or all of the n partial qubits, rather than (or in addition to) each having an independently-defined first major axis.

In the implementation illustrated in FIG. 2, second set of partial qubits 202 comprises one partial qubit. The partial qubit of second set of partial qubits 202 is laid out generally vertically in the plane of the page of FIG. 2, may be referred to herein as having the first orientation and/or as extending substantially along the first direction. The partial qubit of second set of partial qubits 202 has a second longitudinal or second major axis 202*a*, along which a portion of a superconductive loop of the partial qubit of second set of partial qubits 202 extends in a lengthwise direction of the partial qubit (i.e., extends substantially in the first direction). In some implementations, the partial qubit of second set of partial qubits 202 is parallel to second major axis 202*a*.

As both the partial qubit of second set of partial qubits 202 and the partial qubit of first set of partial qubits 201 have the first orientation and extend substantially along the first direction, these partial qubits are substantially parallel with one another. Likewise, first major axis 201*a* is substantially parallel with second major axis 202*a*.

In some implementations, second set of partial qubits 202 may comprise m partial qubits, where m is an integer greater than one. The m partial qubits of second set of partial qubits 202 are parallel with the other m partial qubits. Each of the m partial qubits of second set of partial qubits 202 are also parallel with each of the n partial qubits of first set of partial qubits 201.

In some implementations, each of the m partial qubits in second set of partial qubits 202 has a respective second major axis along which a portion of a respective superconductive loop of each of the m partial qubits extends in a lengthwise direction of the partial qubit (i.e., extends substantially in the first direction). The respective second major axes of the m partial qubits of second set of partial qubits 202 are parallel with the other second major axes and with the first major axes of each of the n partial qubits of first set of partial qubits 201.

In other implementations, all m partial qubits of second set of partial qubits 202 can share a single second major axis 202*a* that is substantially parallel with most or all of m partial qubits, rather than (or in addition to) each having an independently-defined second major axis.

In the illustrated implementation, third set of partial qubits 203 comprises one partial qubit. The partial qubit of third set of partial qubits 203 and third major axis 203*a* are laid out generally horizontally in the plane of the page of FIG. 2, and may be referred to herein as having a "second orientation" and/or as extending substantially along a "second direction". The partial qubit of third set of partial qubits 203 has a third longitudinal or third major axis 203*a*, along which a portion of a superconductive path of the partial qubit of third set of partial qubits 203 extends in a lengthwise direction of the partial qubit (i.e., extends substantially in the second direction). In some implementations, the partial qubit of third set of partial qubits 203 is parallel to third major axis 203*a*. In some implementations, the second orientation can be substantially orthogonal to the first orientation, such that partial qubits extending substantially along the first direction are substantially orthogonal to qubits extending substantially along the second direction.

The partial qubit of third set of partial qubits 203 crosses the partial qubits in first set of partial qubits 201 and second set of partial qubits 202. Likewise, third major axis 203*a* crosses first major axis 201*a* and second major axis 202*a*. While not required, each pair of crossing partial qubits and/or major axes may be substantially orthogonal to one another. For example, in FIG. 2, the partial qubit of third set of partial qubits 203 meets the partial qubit of first set of partial qubits 201 at a 90 degree angle.

In some implementations, third set of partial qubits 203 may comprise k partial qubits, where k is an integer greater than one. The k partial qubits of third set of partial qubits 203 are parallel with the other k partial qubits. Each of the k partial qubits in third set of partial qubits 203 crosses at least one of the partial qubits in each of first set of partial qubits 201 and second set of partial qubits 202.

In some implementations, each of the k partial qubits in third set of partial qubits 203 has a respective third major axis along which a portion of a respective superconductive loop of each of the k partial qubits extends in a lengthwise direction of the partial qubit (i.e., extends substantially in the second direction). The respective third major axes of the k partial qubits of third set of partial qubits 203 are parallel with the other third major axes. Each third major axis the k partial qubits crosses the respective first major axis of at least one of the n partial qubits in first set of partial qubits 201 and crosses the respective second major axis of at least one of the m partial qubits in second set of partial qubits 202 (e.g., third major axis not parallel to first major axis nor at an integer multiple of 180 degrees of first major axis). While not required, partial qubits of each pair of crossing partial qubits and/or major axis of each pair of crossing major axes may be substantially orthogonal to one another.

In other implementations, all k partial qubits of third set of partial qubits 203 can share a single third major axis 203*a* that is substantially parallel with most or all of k partial qubits, rather than (or in addition to) each having an independently-defined third major axis.

As used herein and in the appended claims, the term "crosses", and variants thereof such as cross or crossing, includes meet, overlie, underlie or overlap.

In the illustrated implementation, fourth set of partial qubits 204 comprises one partial qubit. The partial qubit of fourth set of partial qubits 204 and fourth major axis 204*a* are laid out generally horizontally in the plane of the page of FIG. 2, and may be referred to herein as having the second orientation and/or as extending substantially along the second direction. The partial qubit of fourth set of partial qubits 204 has a fourth longitudinal or fourth major axis 204*a*, along which a portion of a superconductive loop of the partial qubit extends in a lengthwise direction of the partial qubit (i.e., extends substantially in the second direction). In some implementations, the partial qubit of fourth set of partial qubits 204 is parallel to fourth major axis 204*a*.

As the partial qubits of third and fourth sets of partial qubits 203, 204 extend substantially in the second direction, these partial qubits are substantially parallel with one another. Fourth major axis 204*a* is also substantially parallel with third major axis 203*a*. The partial qubit of fourth set of partial qubits 204 crosses the partial qubits of first set of partial qubits 201 and second set of partial qubits 202. Likewise, fourth major axis 204*a* crosses first major axis 201*a* and second major axis 202*a* (e.g., fourth major axis not parallel to first or second major axes nor at an integer multiple of 180 degrees of first or second major axes). While not required, the partial qubits of each pair of crossing partial qubits and/or the major axes of each pair of crossing major axes may be substantially orthogonal to one another. For example, in FIG. 2, a partial qubit of fourth set of partial qubits 204 meets a partial qubit of first set of partial qubits 201 at an angle of 90 degrees, and fourth major axis 204*a* meets first major axis 201*a* at an angle of 90 degrees.

In some implementations, fourth set of partial qubits 204 may comprise j partial qubits, where j is an integer greater than one. The j partial qubits of fourth set of partial qubits 204 are parallel with the other j partial qubits. Each of the j partial qubits of fourth set of partial qubits 204 are also parallel with each of the k partial qubits of third set of partial qubits 203. Each of the j partial qubits of fourth set of partial qubits crosses at least one of the n partial qubits of first set of partial qubits 201 and at least one of the m partial qubits of second set of partial qubits 202.

In some implementations, each of the j partial qubits has a respective fourth major axis long which a portion of a superconductive loop of each of the j partial qubits extends in a lengthwise direction of the respective partial qubit (i.e., extends substantially in the second direction). The respective fourth major axes of the j partial qubits of fourth set of partial qubits 204 are parallel with the other fourth major axes and with the third major axes of each of the k partial qubits of third set of partial qubits 203. Each respective fourth major axis of the j partial qubits crosses the respective first major axis of at least one of the n partial qubits in first set of partial qubits 201 and crosses the respective second major axis of at least one of the m partial qubits in second set of partial qubits 202. While not required, the partial qubits of each pair of crossing partial qubits and/or the major axes of each pair of crossing major axes may be substantially orthogonal to one another.

In other implementations, all j partial qubits of fourth set of partial qubits 204 can share a single fourth major axis 204*a* that is substantially parallel to most or all of j partial qubits, rather than (or in addition to) each having an independently-defined fourth major axis.

In some implementations, all partial qubits of first set of partial qubits 201 and second set of partial qubits 202 may share a single major axis, i.e., a first direction major axis. In such an implementation, all partial qubits of first and second sets of partial qubits 201, 202 may be substantially parallel to the first direction major axis. In some implementations, all partial qubits of third set of partial qubits 203 and fourth set of partial qubits 204 may share a single major axis, i.e., a second direction major axis. In such an implementation, all partial qubits of third and fourth sets of partial qubits 203, 204 may be substantially parallel to the second direction major axis. In implementations having a first direction major axis and a second direction major axis, these two major axes may cross one another (e.g., not parallel to one another nor at an integer multiple of 180 degrees of one another) and may be orthogonal to one another.

Cell 200 comprises a first set of couplers 206 comprising couplers 206*a*, 206*b*, 206*c*, and 206*d*. While only individual couplers 206*a*, 206*b*, 206*c*, and 206*d* are called out in FIG. 2, it is to be understood that first set of couplers 206 may include additional individual couplers that are arranged as described herein.

In one implementation, each coupler in first set of couplers 206 communicatively couples a partial qubit extending substantially along the first direction with a partial qubit extending substantially along the second direction. A coupler in first set of couplers 206 can communicatively couple a partial qubit in first set of partial qubits 201 to one of: a partial qubit in third set of partial qubits 203 or a partial qubit in fourth set of partial qubits 204. Other couplers in first set of couplers 206 can communicatively couple a partial qubit in second set of partial qubits 202 to one of: a partial qubit in third set of partial qubits 203 or a partial qubit in fourth set of partial qubits 204.

In one implementation, each coupler in first set of couplers 206 is positioned at regions proximate to where partial qubits extending substantially along the first direction meet partial qubits extending substantially along the second direction. That is, each coupler in first set of couplers 206 can be located at a region where: a partial qubit in first set of partial qubits 201 or partial qubit in second set of partial qubits 202 crosses a partial qubit in third set of partial qubits 203 and/or a partial qubit in fourth set of partial qubits 204. In some implementations, couplers may be located at some distance from the regions where a partial qubit of first or second set of partial qubits 201, 202 meets a partial qubit of third or fourth set of partial qubits 203, 204.

Cell 200 further comprises a second set of couplers 208 comprising couplers 208*a* and 208*b*. While only individual couplers 208*a* and 208*b* are called out in FIG. 2, it is to be understood that second set of couplers 208 may include additional individual couplers that are arranged as described herein.

In one implementation, each coupler in second set of couplers 208 communicatively couples a pair of partial qubits of different sets of partial qubits that have like orientations (e.g., same orientation, substantially parallel orientations). Some couplers in second set of couplers 208 communicatively couple a partial qubit in first set of partial qubits 201 to a partial qubit in second set of partial qubits 202. Other couplers in second set of couplers 208 communicatively couple a partial qubit in third set of partial qubits 203 to a partial qubit in fourth set of partial qubits 204.

In another implementation, each coupler in second set of couplers 208 communicatively couples each partial qubit in first set of partial qubits 201 to its nearest-neighboring partial qubit in second set of partial qubits 202 or communicatively couples each partial qubit in third set of partial qubits 203 to its nearest-neighboring partial qubit in fourth set of partial qubits 204.

Cell 200 further comprises a set of partial couplers 210 comprising partial couplers 210*a*, 210*b*, 210*c*, and 210*d*. While only individual partial couplers 210*a*, 210*b*, 210*c*, and 210*d* are called out in FIG. 2, it is to be understood that set of partial couplers 210 may include additional individual couplers that are arranged as described herein. Each partial coupler in set of partial couplers 210*a*, 210*b*, 210*c*, 210*d* comprises at least a portion of a length of a whole coupler, and a whole coupler may be shared among more than one cells.

Figure 3:
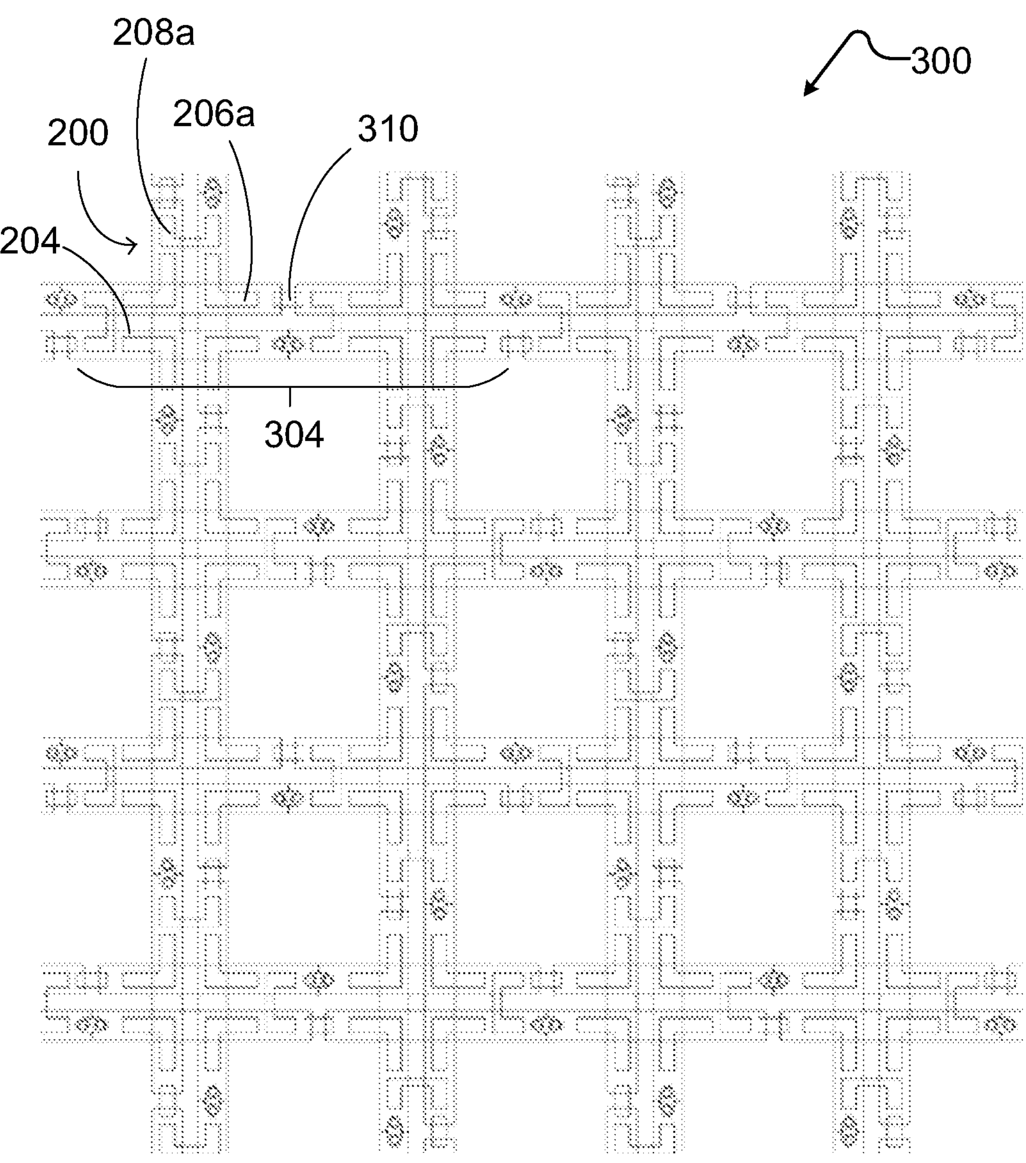
FIG. 3 is a schematic diagram of an example topology of a quantum processor, based on the example cell of FIG. 2, in accordance with the present systems and devices.

FIG. 3 is a schematic diagram of an example of a topology 300 of a quantum processor. Topology 300 comprises a grid or array of cells 200 of FIG. 2, though only one cell 200 is called out in FIG. 3. The terms: "grid" and "array" are used interchangeably herein and in the claims to indicate an ordered, repeating pattern or arrangement along one or more directions. Those skilled in the relevant art will recognize that, in some implementations, tiling of cell 200 may include rotation mirroring to produce a desired topology.

Alternative implementations of topology 300 may comprise grids or arrays made up of several different types of cells (e.g., cells in a topology may have different cell architectures or cell topologies from one another), which may be tiled in a repeated pattern across all or a portion of topology 300 of the quantum processor.

In topology 300, a whole set of qubits is formed by a combination of at least one set of partial qubits in each cell 200 and a set of partial qubits in an adjacent cell. As an example, the partial qubit in fourth set of partial qubits 204 of cell 200 combines with a partial qubit in an adjacent cell to form whole qubit 304 (additional partial qubits and whole qubits are not called out in FIG. 3). In the illustrated implementation, each whole qubit spans a majority of the length of two cells.

In topology 300, at least one partial coupler in set of partial couplers in each cell, such as one of the partial couplers in set of partial coupler 210 in cell 200, combines with at least one partial coupler of a set of partial couplers in an adjacent cell to form a set of inter-cell couplers. Each inter-cell coupler communicatively couples co-linear pairs of partial qubits in different cells of a same set of partial qubits. An example inter-cell coupler 310 is called out in FIG. 3 (additional inter-cell couplers are not called out in FIG. 3).

In topology 300, couplers in first set of couplers 206 communicatively couple pairs of crossing partial qubits (e.g., a partial qubit extending substantially along the first direction and a partial qubit extending substantially along the second direction). While only one coupler 206*a* in first set of couplers called out in FIG. 3, it is to be understood that a plurality of couplers in first set of couplers 206 are arranged as described above. The couplers in first set of couplers 206 are hereinafter also interchangeably referred to as "internal couplers".

In topology 300, couplers in second set of couplers 208 communicatively couple similarly oriented partial qubits (e.g., substantially parallel partial qubits of different sets of partial qubits). While only one coupler 208*a* in second set of couplers called out in FIG. 3, it is to be understood that a plurality of couplers in second set of couplers 208 are arranged as described above. The couplers in second set of couplers 208 are hereinafter also interchangeably referred to as "odd couplers" both herein and in the claims.

In the illustrated implementation of FIG. 3, each whole qubit is incident to two odd couplers, two internal couplers, and up to two inter-cell couplers. In some implementations, topology 300 may comprise a grid or array of cells each having 4i partial qubits, where i is an integer greater than one. In such implementations, each whole qubit is incident to two odd couplers, 2i internal couplers, and up to two inter-cell couplers, for a total degree of at least 2i+4 couplers. As used herein, the term "degree" refers to the number of couplers or partial couplers that connect a whole qubit to its neighbors.

Figure 4:
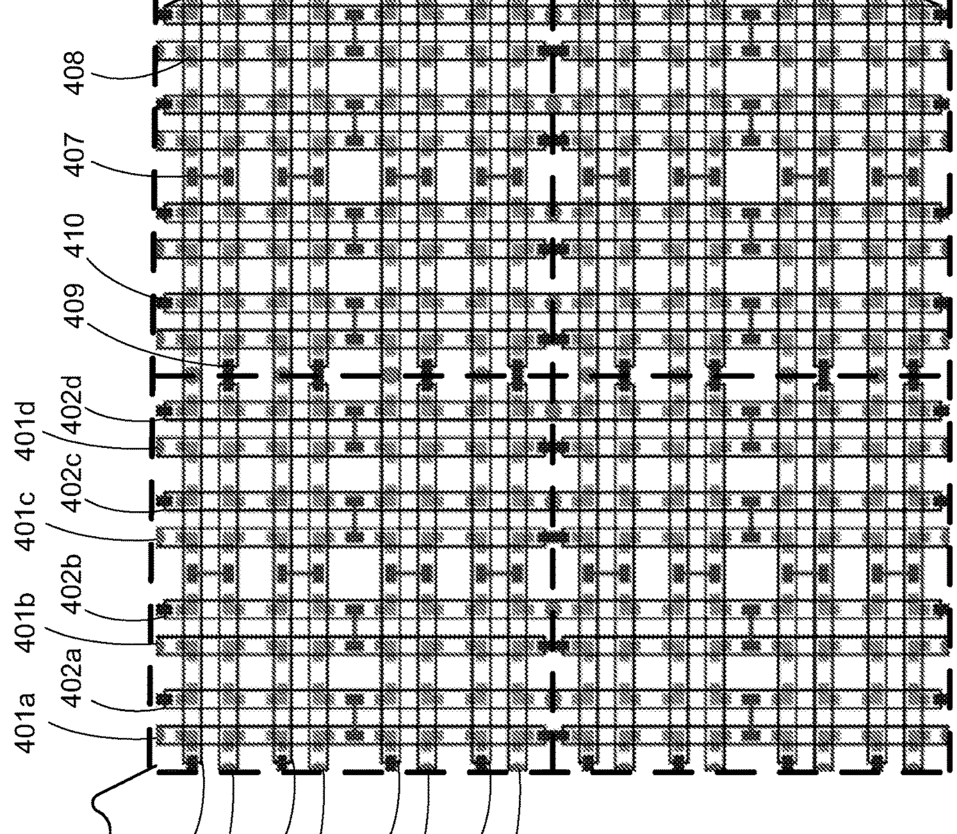
FIG. 4 is a schematic diagram of an example topology of a quantum processor, based on an alternative example cell, in accordance with the present systems and devices.

FIG. 4 is a schematic diagram of a different example of a topology 400 of a quantum processor, in accordance with the present systems and devices. FIG. 4 shows topology 400, which includes a two-by-two grid or two-dimensional array of cells. Although four cells are shown, only one cell 405 is called out in FIG. 4. The broken lines in FIG. 4 show the approximate outline of each of cell 405 and are included for illustrative purposes only.

Similar to cell 200, each cell 405 comprises four sets of partial qubits: a first set of partial qubits 401 comprising partial qubits 401*a*, 401*b*, 401*c* and 401*d* (only individual partial qubits 401*a*, 401*b*, 401*c* and 401*d* are called out in FIG. 4); a second set of partial qubits 402 comprising partial qubits 402*a*, 402*b*, 402*c* and 402*d* (only individual partial qubits 402*a*, 402*b*, 402*c* and 402*d* are called out in FIG. 4); a third set of partial qubits 403 comprising partial qubits 403*a*, 403*b*, 403*c* and 403*d* (only individuals partial qubits 403*a*, 403*b*, 403*c* and 403*d* are called out in FIG. 4); and a fourth set of partial qubits 404 comprising partial qubits 404*a*, 404*b*, 404*c* and 404*d* (only individual partial qubits 404*a*, 404*b*, 404*c* and 404*d* called out in FIG. 4). As such, there is a total of sixteen partial qubits per cell (said partial qubits are only called out in one cell 405 in FIG. 4).

Partial qubits in first set of partial qubits 401 and second set of partial qubits 402 are laid out generally vertically in the plane of the page of FIG. 4, and may be referred to herein as having the first orientation and/or extending substantially along the first direction. As such, each of the partial qubits in first set of partial qubits 401 and second set of partial qubits 402 are substantially parallel with one another.

Partial qubits in third set of partial qubits 403 and fourth set of partial qubits 404 are laid out generally horizontally in the plane of the page of FIG. 4, and may be referred to herein as having the second orientation and/or as extending along the second direction. As such, each of the partial qubits in third set of partial qubits 403 and fourth set of partial qubits 404 are substantially parallel with one another.

The first orientation and the second orientation, and likewise the first direction and the second direction, are different from one another and can optionally be substantially orthogonal to one another. Partial qubits in first and second sets of partial qubits 401, 402 cross partial qubits in third and fourth sets of partial qubits 403, 404, for example crossing at approximately 90 degree angles or at non-orthogonal angles (e.g., second orientation is not parallel to first orientation nor an integer multiple of 180 degrees of first orientation).

In some implementations of topology 400, first set of partial qubits 401 can have a first major axes, along which the portions of superconductive loops of the partial qubits of first set of partial qubits 401 extend in a lengthwise direction. Each of second, third, and fourth set of partial qubits 402, 403, 404 can have a respective second, third, and fourth major axis that are similarly defined along a lengthwise direction of each set's partial qubits. The first and second major axes are substantially parallel with one another, extending substantially in the first direction. The third and fourth major axes are substantially parallel with one another, extending substantially in the second direction. Each of the first and second major axes crosses each of the third and fourth major axes. The major axes of each pair of crossing major axes can be substantially orthogonal to one another, or can cross at non-orthogonal angles.

In some other implementations of topology 400, each partial qubit in cell 405 can optionally have a major axis (said major axes not called out in FIG. 4). The respective first major axis of each partial qubit in first set of partial qubits 401 is parallel with the other first major axes of the other partial qubits in first set of partial qubits 401, and is substantially parallel with the second major axes of partial qubits in second set of partial qubits 402. The respective third major axis of each partial qubit in third set of partial qubits 403 is parallel with the other third major axes of the other partial qubits in third set of partial qubits 403, and is substantially parallel with the fourth major axes of partial qubits in fourth set of partial qubits 404. A respective major axis of each of the partial qubits in first set of partial qubits 401 and second set of partial qubits 402 crosses at least one third major axes of a respective partial qubit in third set of partial qubits 403 and at least one fourth major axis of a respective partial qubit in fourth set of partial qubits 404. The major axes of each pair of crossing major axes can be substantially orthogonal to one another, or can cross at non-orthogonal angles.

Topology 400 includes a plurality of sets of couplers, including a set of odd-couplers, a set of internal couplers, and a set of inter-cell couplers, which are arranged as previously described with respect to first set of couplers 206, second set of couplers 208, and set of partial couplers 210 in cell 200 and topology 300.

The following components are called out in FIG. 4: an odd coupler 407, an internal coupler 408, and a whole inter-cell coupler 409. In topology 400, each partial qubit is incident one odd coupler, eight internal couplers, and up to one whole inter-cell coupler.

In topology 400, each whole qubit spans a majority of a length of two cells (an example whole qubit 406 is called out in FIG. 4). Whole qubits are incident two odd couplers, sixteen internal couplers, and two partial inter-cell couplers, for a total degree of 20 (an example partial inter-cell coupler 410 is called out in FIG. 4). In alternative implementations where topology 400 has additional cells, whole qubits may be incident two odd couplers, sixteen internal couplers, and up to two whole inter-cell couplers, such that there is still a total degree of 20.

Many techniques for using quantum processors to solve computational problems involve finding ways to directly map a representation of a problem to the quantum processor itself. Given the generally fixed topology and/or fixed connectivity of a hardware processor, some classes of problem may benefit from embedding techniques. Examples of embedding techniques are described in U.S. Pat. Nos. 7,984,012; 8,244,662; and US Patent Publication 2014/0250288 (now U.S. Pat. No. 9,501,747). Examples of fixed topologies include the Chimera topology and the Pegasus topology. These topologies, along with other examples of quantum processor topologies, are described in greater detail in International Patent Application WO2006066415, (now U.S. Pat. No. 7,533,068); U.S. Pat. Nos. 9,170,278; and 9,178,154; and U.S. patent application Ser. No. 16/307,382 (now Patent Application Publication No. 2019/0220771).

Topologies 300 and 400 have greater connectivity than the Pegasus and Chimera topologies. The term "connectivity" describes the number of possible or available communicative coupling paths that are available (e.g., whether active or not) to directly communicably couple pairs of qubits in a quantum processor without the use of intervening qubits. Topologies 300 and 400 may therefore be suitable for solving larger and more complex problems, beneficially reducing the need for employing embedding techniques to overcome a limited connectivity.

A clique is a fully connected subgraph of n nodes, in which each node in the subgraph is connected to one another. A clique embedding can be defined as embedding a clique in a graph representing the structure of a hardware processor. Methods and algorithms exist for finding clique embeddings in Chimera graphs, such as, for example the method described in Boothby et al. (see: http://arxiv.org/abs/1507.04774). It is possible to employ existing methods to construct clique embeddings using the topology graphs described in this specification by constructing logical or virtual 'sub-qubits' joined together with logical or virtual couplers to produce Chimera-like graph on which to run existing algorithms. It will be understood that clique embeddings may be found in Chimera graph by employing any suitable method or algorithm, and finding clique embeddings from Chimera-like graphs resulting from graphs produced according to the present specification and appended claims are not restricted to a particular method or algorithm.

Methods exist for embedding two-dimensional and three-dimensional lattices in Chimera and Pegasus graphs. Examples of such methods are described in King et al. (see: https://arxiv.org/pdf/2007.10555.pdf) and King and Bernoudy (see: https://arxiv.org/pdf/2009.12479.pdf9.pdf). It is possible to employ existing methods to embed two-dimensional and three-dimensional lattices in the topology graphs described and/or illustrated in the present application. Further, the topology graphs described and/or illustrated in the present application may support two- and three-dimensional lattice embeddings with equal or shorter chain lengths than supported by existing topologies. It will be understood that two- and three-dimensional lattices may be embedded in topology graphs described and/or illustrated in the present application employing any suitable method and are not restricted to a particular method.

Example Superconducting Flux Qubit

Figure 5:
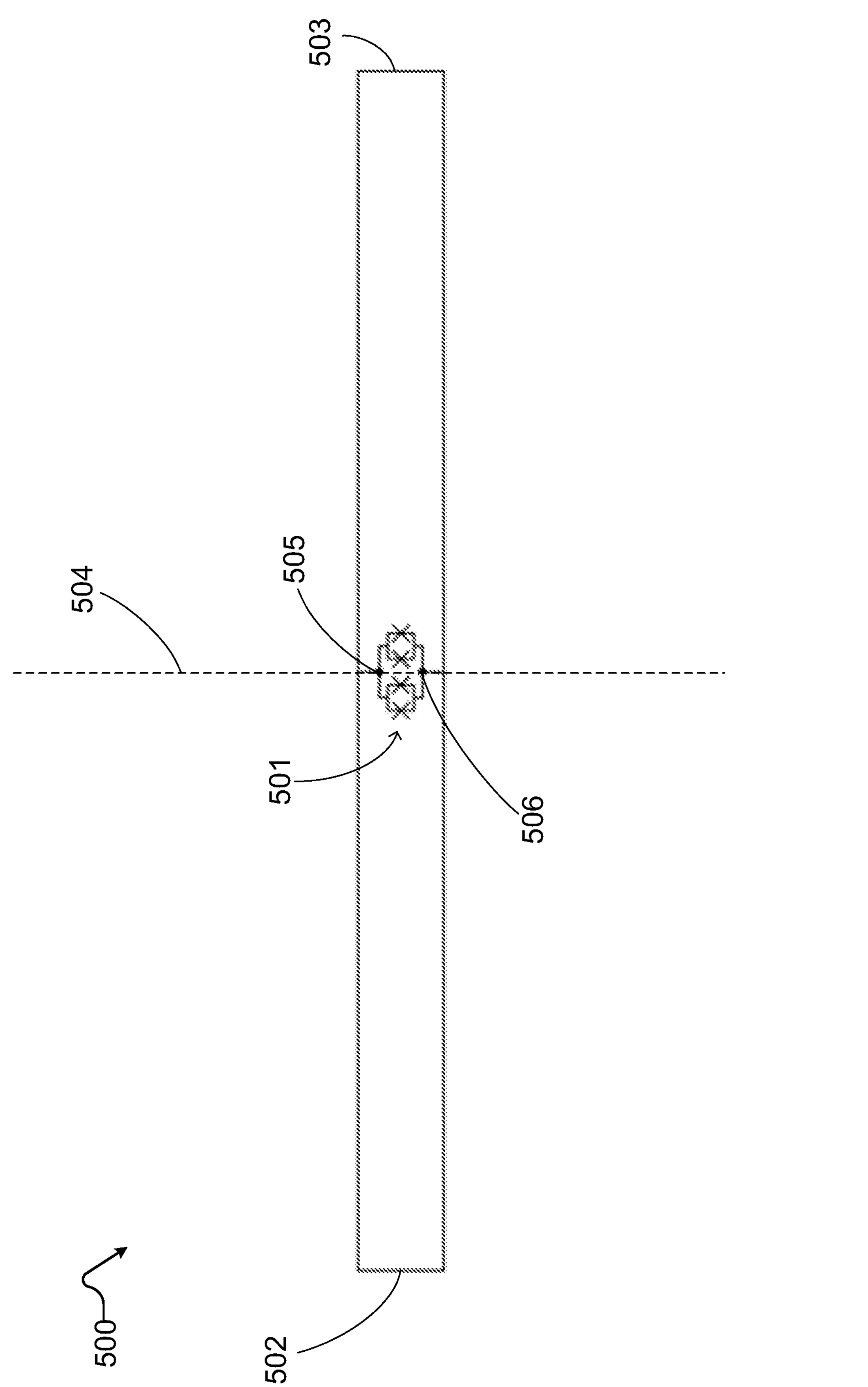
FIG. 5 is a schematic diagram of an example qubit which, for example, can be employed in the topologies of FIGS. 3 and 4, in accordance with the present systems and devices.

FIG. 5 is a schematic diagram of an example of a superconducting flux qubit 500. Superconducting flux qubit 500 can optionally be employed in topology 300 of FIG. 3 and/or topology 400 of FIG. 4. Superconducting flux qubit 500 may include a loop of superconducting material interrupted by a Josephson junction. The superconducting material may be a material that exhibits superconducting behavior at and below a critical temperature that is inherent to the material. In some implementations, it may be beneficial to provide a multi-loop flux qubit, which may allow for increased connectivity between qubits and thus influence the type and complexity of problems that may be solved by the quantum processor.

In the example implementation of FIG. 5, superconducting flux qubit 500 comprises a compound-compound Josephson junction (CCJJ) 501. In another implementation, superconducting flux qubit 500 may comprise a Josephson junction that is a compound Josephson junction (CJJ).

In the illustrated implementation, a first qubit loop 502 is formed by a first superconducting current path, and a second qubit loop 503 is formed by a second superconducting current path. First qubit loop 502 and second qubit loop 502 are electrically coupled in parallel across CCJJ 501. A qubit with two loops, such as superconducting flux qubit 500, may also be referred to as a "butterfly" qubit or a "two-wing" qubit, where each of the loops constitutes one of the wings. In the example implementation of FIG. 5, first qubit loop 502 and second qubit loop 503 are substantially symmetric about an axis 504 of CCJJ 501. Axis 504 intersects a first connection point 505 between first and second qubit loops 502, 503 and CCJJ 501. Axis 504 also intersects a second connection point 506 between first and second qubit loops 502, 502 and CCJJ 501.

The example qubit shown in FIG. 5 is not limiting; in other implementations, topologies 300 and 400 may include qubits of another type (e.g., single loop flux qubits).

Post-Amble

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,135,701; 7,418,283; 7,533,068; 7,984,012; 8,008,942; 8,190,548; 8,195,596; 8,244,662; 8,421,053; 8,772,759; 9,170,278; 9,178,154; 9,501,747; and 9,710,758; U.S. Patent Application Publication No. 2019/0220771; U.S. Patent Application No. 62/346,917 filed Jun. 7, 2016; U.S. Patent Application No. 62/400,990 filed Sep. 28, 2016; A1; U.S. Patent Application No. 63/227,395 filed Jul. 30, 2021; and PCT Patent Application No. PCT/US2020/065150.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A quantum processor comprising:

a plurality of cells tiled over an area such that each cell of the plurality of cells is positioned proximately adjacent at least one other cell of the plurality of cells, each cell comprising:

a plurality of partial qubits, wherein each partial qubit in the plurality of partial qubits comprises at least a portion of a length of a whole qubit, the plurality of partial qubits comprising:

a first set of partial qubits, each partial qubit in the first set of partial qubits extending substantially along a first direction, a second set of partial qubits, each partial qubit in the second set of partial qubits extending substantially along the first direction, wherein each partial qubit in the second set of partial qubits is substantially parallel with each partial qubit in the first set of partial qubits, a third set of partial qubits, each partial qubit in the third set of partial qubits extending substantially along a second direction, wherein each partial qubit in the third set of partial qubits crosses at least one partial qubit in the first set of partial qubits and at least one partial qubit in the second set of partial qubits, and a fourth set of partial qubits, each partial qubit in the fourth set of partial qubits extending substantially along the second direction, wherein each partial qubit in the fourth set of partial qubits is substantially parallel with each partial qubit in the third set of partial qubits, and wherein each partial qubit in the fourth set of partial qubits crosses at least one partial qubit in the first set of partial qubits and at least one partial qubit in the second set of partial qubits;

a first set of couplers, wherein each coupler in the first set of couplers communicatively couples a partial qubit of the plurality of partial qubits extending substantially along the first direction and a partial qubit of the plurality of partial qubits extending substantially along the second direction; and a second set of couplers, wherein each coupler in the second set of couplers communicatively couples a partial qubit in the first set of partial qubits to a partial qubit in the second set of partial qubits, or a partial qubit in the third set of partial qubits to a partial qubit in the fourth set of partial qubits; and a set of inter-cell couplers, each inter-cell coupler of the set of inter-cell couplers communicatively coupling-couples two partial qubits in adjacent cells of the plurality of cells wherein the two partial qubits belong to a same one of a respective first, second, third, or fourth set of partial qubits of each one of the adjacent cells.

2. The quantum processor of claim 1, wherein partial qubits of the plurality of partial qubits extending substantially along the first direction are substantially orthogonal to partial qubits of the plurality of partial qubits extending substantially along the second direction.

3. The quantum processor of claim 1, wherein each partial qubit in at least one of the first set of partial qubits, the second set of partial qubits, the third set of partial qubits, and the fourth set of partial qubits comprises half of the length of a whole qubit.

4. The quantum processor of claim 1, wherein at least one set of partial qubits in each cell of the plurality of cells forms a set of whole qubits with a set of partial qubits in an adjacent cell of the plurality of cells.

5. The quantum processor of claim 3, wherein each whole qubit in a set of whole qubits spans a majority of a length of two cells of the plurality of cells.

6. The quantum processor of claim 1, wherein:

the partial qubits of the first set of partial qubits extend substantially parallel to a first major axis, the first major axis extending substantially along the first direction;

the partial qubits of the second set of partial qubits extend substantially parallel to a second major axis along a second major axis, the second major axis extending substantially along the first direction;

the partial qubits of the third set of partial qubits extend substantially parallel to a third major axis, the third major axis extending substantially along the second direction; and the partial qubits of the fourth set of partial qubits extend substantially parallel to a fourth major axis, the fourth major axis extending substantially along the second direction, wherein both of the first major axis and the second major axis cross both of the third major axis and the fourth major axis.

7. The quantum processor of claim 6, wherein pairs of crossing major axes are substantially orthogonal to one another.

8. The quantum processor of claim 1, wherein:

each partial qubit of the first set of partial qubits extends substantially parallel to a respective first major axis, each respective first major axis extending substantially along the first direction, wherein each respective first major axis is parallel to all other first major axes of other partial qubits in the first set of partial qubits;

each partial qubit of the second set of partial qubits extends substantially parallel to a respective second major axis, each respective second major axis extending substantially along the first direction, wherein each respective second major axis is parallel to all other second major axes of other partial qubits in the second set of partial qubits and the first major axis of the partial qubits in the first set of partial qubits;

each partial qubit of the third set of partial qubits extends substantially parallel to a respective third major axis, each respective third major axis extending substantially along the second direction, wherein each respective third major axis is parallel to all other third major axes of other partial qubits in the third set of partial qubits; and each partial qubit of the fourth set of partial qubits extends substantially parallel to a respective fourth major axis, each respective fourth major axis extending substantially along the second direction, wherein each respective fourth major axis is substantially parallel to all other fourth major axes of other partial qubits in the fourth set of partial qubits and the third major axis of the partial qubits in the third set of partial qubits.

9. The quantum processor of claim 8, wherein:

each respective first major axis of each partial qubit in the first set of partial qubits crosses: at least one third major axis and at least one fourth major axis;

each respective second major axis of each partial qubit in the second set of partial qubits crosses: at least one third major axis and at least one fourth major axis;

each respective third major axis of each partial qubit in the third set of partial qubits crosses: at least one first major axis and at least one second major axis; and each respective fourth major axis of each partial qubit in the fourth set of partial qubits crosses: at least one first major axis and at least one second major axis.

10. The quantum processor of claim 9, wherein each pair of crossing major axes are substantially orthogonal to one another.

11. The quantum processor of claim 1, wherein each coupler in the first set of couplers is positioned at a region proximate to a location at which the partial qubit extending substantially along the first direction meets the partial qubit extending substantially along the second direction.

12. The quantum processor of claim 1, wherein;

each coupler in the second set of couplers communicatively couples each partial qubit in the first set of partial qubits to a nearest-neighboring partial qubit in the second set of partial qubits, or each coupler in the second set of couplers communicatively couples each partial qubit in the third set of partial qubits to a nearest-neighboring partial qubit in the fourth set of partial qubits.

13. The quantum processor of claim 1, wherein each whole qubit is a superconducting flux qubit.

14. The quantum processor of claim 13, wherein each whole qubit comprises:

a Josephson junction;

a first qubit loop formed by a first superconducting current path; and a second qubit loop formed by a second superconducting current path, wherein the first qubit loop and the second qubit loop are electrically coupled in parallel across the Josephson junction, and wherein the first qubit loop and the second qubit loop each comprise a material that exhibits superconducting behavior at and below a critical temperature.

15. The quantum processor of claim 14, wherein the Josephson junction is selected from a group consisting of: a compound Josephson junction and a compound-compound Josephson junction.

16. The quantum processor of claim 14, wherein the first qubit loop and the second qubit loop are substantially symmetric about an axis of the Josephson junction, the axis of the Josephson junction intersecting:

a first connection between the first qubit loop, the second qubit loop, and the Josephson junction, and a second connection between the first qubit loop, the second qubit loop, and the Josephson junction.

* * * * *